(12) United States Patent
Tsang

(10) Patent No.: US 8,587,009 B2
(45) Date of Patent: Nov. 19, 2013

(54) LIGHT EMITTING CHIP PACKAGE

(75) Inventor: Jian-Shihn Tsang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 5 days.

(21) Appl. No.: 13/306,818

(22) Filed: Nov. 29, 2011

(65) Prior Publication Data

US 2013/0026529 A1 Jan. 31, 2013

(30) Foreign Application Priority Data

Jul. 29, 2011 (TW) .............................. 100127047 A

(51) Int. Cl.
*H01L 21/00* (2006.01)
(52) U.S. Cl.
USPC ................. 257/98; 257/81; 257/99; 257/100; 257/E21.415
(58) Field of Classification Search
USPC ............... 257/98–100, 12–13, 81, 84, 88–89, 257/431–433, 344, 347–348, 706–707; 313/112, 501, 503, 506
See application file for complete search history.

(56) References Cited

U.S. PATENT DOCUMENTS

| | | | | |
|---|---|---|---|---|
| 6,531,328 B1 * | 3/2003 | Chen | ............................... | 438/26 |
| 2006/0220036 A1 * | 10/2006 | Lee et al. | ........................ | 257/81 |
| 2008/0099770 A1 * | 5/2008 | Mendendorp et al. | ........... | 257/79 |
| 2008/0237621 A1 * | 10/2008 | Takemoto | ....................... | 257/98 |

* cited by examiner

*Primary Examiner* — Dung A. Le
(74) *Attorney, Agent, or Firm* — Altis & Wispro Law Group, Inc.

(57) ABSTRACT

A light emitting chip package includes a substrate, an insulation layer, a patterned electric conductive layer, a light emitting chip, an encapsulation, a plurality of thermal conductors and electrical conductors. The insulation layer is formed on a top surface of the substrate. The patterned electric conductive layer partially covers the insulation layer. The light emitting chip is arranged on the electric conductive layer. The encapsulation covers the light emitting chip and the electric conductive layer. The plurality of thermal conductors is formed at a bottom surface side of the substrate. The plurality of electrical conductors penetrates the insulation layer and connects the conductive layer with the thermal conductor. The plurality of electrical conductors is isolated from each other.

7 Claims, 12 Drawing Sheets

LIGHT EMITTING CHIP PACKAGE

BACKGROUND

1. Technical Field

The present disclosure generally relates to light emitting chip packages, and method for making the same.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

However, since the LED radiates large amounts of heat when current is applied thereto, an LED must efficiently radiate large amounts of heat generated upon operation thereof, to achieve high reliability.

During package process of LEDs, a substrate for supporting a LED chip is generally configured with a plurality of through holes adapted to have electrode inserted therein. However, it is hard to avoid gaps remained between interior sidewalls of the through holes and the electrode portions. As such, leak of adhesive undesirably occurs during the injection of liquid encapsulating materials.

Therefore, what is needed is to provide an LED package capable of effectively avoid adhesive leak in the packaging process.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present light emitting chip package structure and method for making the same, in detail.

Figure 1:
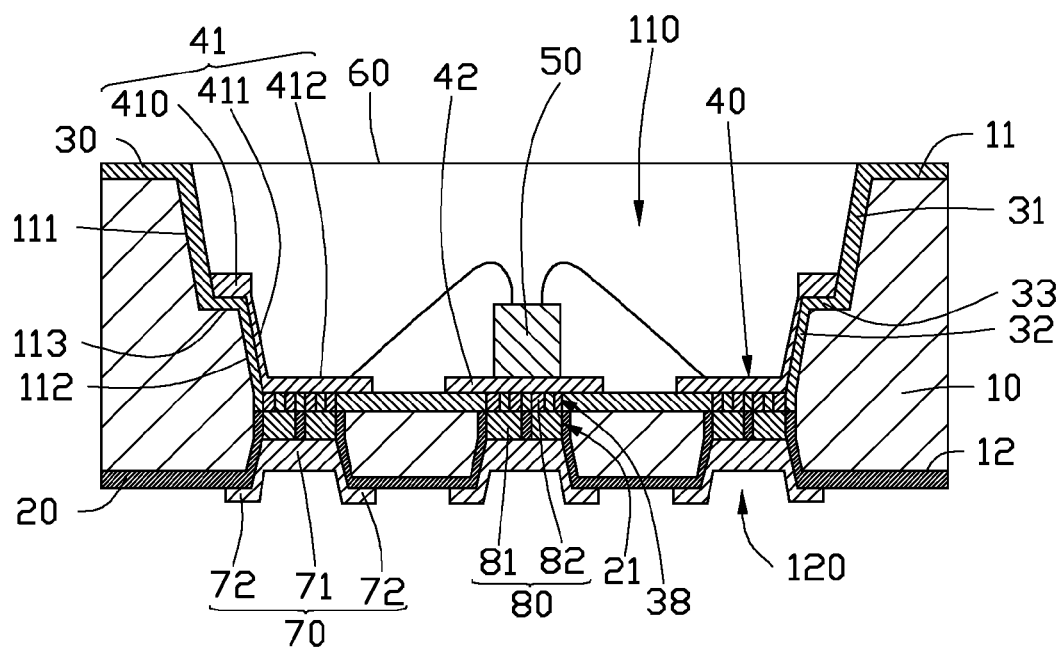
FIG. 1 is a schematic cross section of a light emitting chip package in accordance with a first embodiment of the present disclosure.

Referring to FIG. 1, a light emitting chip package according to a first embodiment includes a substrate 10, an etch stop layer 20, an insulation layer 30, an electric conductive layer 40, a light emitting chip 50, an encapsulation 60, a plurality of metallic thermal conductors 70 and a plurality of electrical conductors 80.

The substrate 10 includes a top surface 11 and a bottom surface 12 opposite to the top surface 11. The substrate 10 can be made of electrical conductive materials, for example cooper. The substrate 10 can also be made of insulated materials such as silicon (Si), gallium arsenide (GaAs), zinc oxide (ZnO), indium phosphide (InP) and combination thereof.

A step hole 110 is formed in the top surface 11. The step hole 110 includes two side surfaces symmetric to each other. Each side surface of the step hole 110 includes two inclined surfaces 111, 112 and a horizontal surface 113 connected therebetween. An average distance between the inclined surfaces 111 of the two symmetric side surfaces is larger than that between the inclined surfaces 112 of the two symmetric side surfaces. That is, the step hole 110 has a configuration generally tapering downwardly.

A plurality of recesses 120 is formed, apart from each other, on the bottom substrate 10. Each recess 120 is isolated from the step hole 110 by the etch stop layer 20. In this embodiment, three recesses 120 are defined in the bottom surface 12 of the substrate 10.

The etch stop layer 20 is formed on the bottom surface 12. The etch stop layer 20 can be made of insulating materials, for example silicon dioxide ($SiO_2$) or silicon nitride ($Si_3N_4$). The etch stop layer 20 extends over the side walls of the recesses 120 and transverse tops thereof. The etch stop layer 20 is exposed, at the tops of the recesses 120, to the step hole 110. In this embodiment, the etch stop layer 20 defines two second through holes 21 at the top of each recess 120. The second through holes 21 of the etch stop layer 20 are isolated from each other, and each second through hole 21 is filled with an electrical conductor 81.

The plurality of metallic thermal conductors 70 are formed on the etch stop layer 20, and partly received in a respective recess 120. The metallic thermal conductors 70 are made of metal. In this embodiment, there are three metallic thermal conductors 70 each including a main body 71 and two side portions 72 symmetrical to each other. The main body 71 of the metallic thermal conductor 70 sits in a corresponding recess 120 and contacts the electrical conductor 81 exposed at top of the recess 120. The two side portions 72 each extend from a lateral side of the main body 71, firstly along an inclined side surface of the recess 120 and then along a horizontal bottom surface of the etch stop layer 20. As such, the side portions 72 each define a bent distal ends abutting a bottom the etch stop layer 20.

The insulation layer 30 is formed on the top surface 11 of the substrate 10, and traverses the side surfaces and bottom of the step hole 110. The insulation layer 30 includes two inclined portions 31, 32 and a horizontal portion 33 connected therebetween. The inclined portions 31, 33 are respectively attached to the inclined surfaces 111, 112. The horizontal portion 33 is attached to the horizontal surface 113. Further, at the bottom of the step hole 110, the insulation layer 30 contacts the exposed etch stop layer 20. The insulation layer 30 can be made of insulating materials such as silicon dioxide ($SiO_2$), silicon nitride ($Si_3N_4$) and so on. The insulation layer 30 defines a plurality of first through holes 38 communicated with the second through holes 21 of the etch stop layer 20. The first through holes 38 of the insulation layer 30 are isolated from each other, and each first through hole 38 is filled with an electrical conductor 82. The electrical conductors 82 each contact a corresponding electrical conductor 81, thereby forming an electrical connection therebetween. In this embodiment, the insulation layer 30 defines four first through holes 38 therein, different from that of the second through holes 21 defined in the etch stop layer 20. Referring to FIG. 1, a diameter of each of the second through holes 21 in the etch stop layer 20 is greater than that of each of the first through holes 38 in the insulating layer 30.

The electric conductive layer 40 is formed on the insulation layer 30. The electric conductive layer 40 has a patterned configuration, and includes a plurality of isolated portions acting as electrodes. In this embodiment, the electric conductive layer 40 includes two first electrodes 41 symmetrical to each other, and a second electrode 42 between the two first electrodes 41.

The two first electrodes 41 each includes a retaining portion 410, a reflecting portion 411 and a connecting portion 412. The retaining portion 410 is formed and attached on the horizontal portion 33 of the insulation layer 30. The reflecting portion 411 is formed and attached on the inclined portion 31 of the insulation layer 30, thereby performing a reflecting function. The connecting portion 412 contacts the electrical conductors 82 underneath and forms an electrical connection there between.

The second electrode 42 is for contacting the electrical conductors 82 underneath and supporting the light emitting chip 50. In this embodiment, the second electrode 42 is a rectangular flat plate.

The light emitting chip 50 is arranged on the second electrode 42. The light emitting chip 50 can be a light emitting diode. In this embodiment, the light emitting chip 50 is a light emitting diode wire bonded to the two first electrodes 41.

The encapsulation 60 is arranged in the step hole 110 to cover the light emitting chip 50. A top surface of the encapsulation 60 is coplanar with that of the insulation layer 30. The encapsulation 60 is made of light transmissive materials. The encapsulation 60 can also be doped with a fluorescent substance.

Due to the through holes defined in the package structure are filled with the electrical conductors 81, 82, and covered by the electric conductive layer 40 and the metallic thermal conductor 70 at two ends thereof. The electric conductive layer 40 and the metallic thermal conductor 70 cooperatively perform a sealing function to effectively avoid leaking of adhesive during the packaging process.

Figure 2:
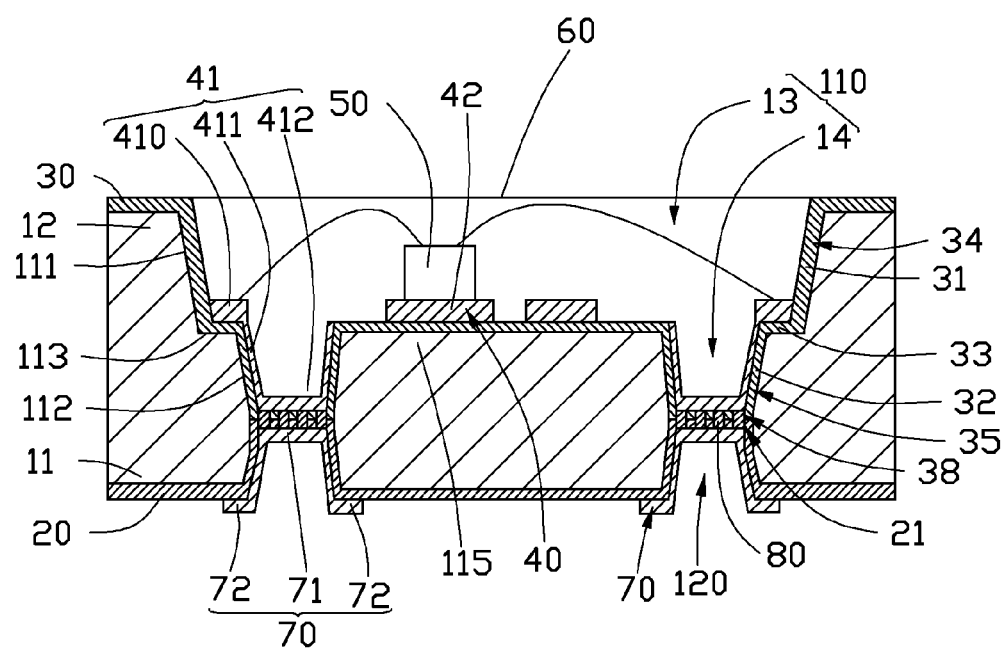
FIG. 2 is a schematic cross section of a light emitting chip package in accordance with a second embodiment of the present disclosure.

Referring to FIG. 2, a light emitting chip package according to a second embodiment has a configuration similar to the first embodiment. The light emitting chip package according to the second embodiment also includes a substrate 10, an etch stop layer 20, an insulation layer 30, an electric conductive layer 40, a light emitting chip 50, an encapsulation 60, a plurality of metallic thermal conductors 70 and a plurality of electrical conductors 80.

The difference from the first embodiment is that, the step hole 110 of the second embodiment includes a platform 115 protruding from a bottom thereof. The platform 115 divides the step hole 110 into an upper hole 13 and a lower hole 14 at a bottom of the upper hole 13. The etch stop layer 20 and the insulation layer 30 are made of same materials. A plurality of electrical conductors 80 penetrates through the etch stop layer 20 and the insulation layer 30, to connect the first electrode 41 with the metallic thermal conductors 70. The second electrode 42 is isolated from the electrical conductors 80 and sits on the platform 115, merely performing a supporting function for the light emitting chip 50.

Figure 3:
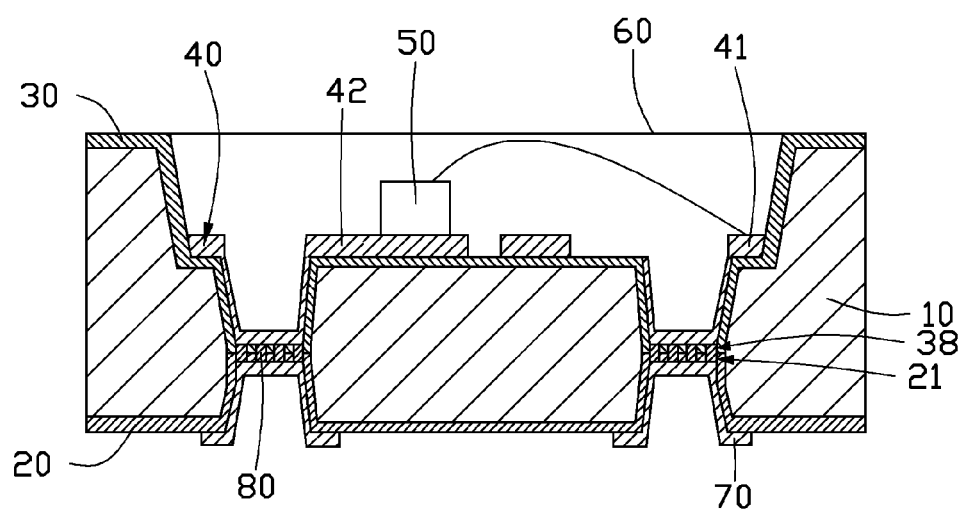
FIG. 3 is a schematic cross section of a light emitting chip package in accordance with a third embodiment of the present disclosure.

Referring to FIG. 3, a light emitting chip package according to a third exemplary embodiment has a configuration similar to the second embodiment. The light emitting chip package according to the third embodiment also includes a substrate 10, an etch stop layer 20, an insulation layer 30, an electric conductive layer 40, a light emitting chip 50, an encapsulation 60, a plurality of metallic thermal conductors 70 and a plurality of electrical conductors 80.

The difference from the second embodiment is that, the electric conductive layer 40 of the third embodiment includes a first electrode 41 on right hand side, and a second electrode 42 on left hand side. The first and second electrodes 41, 42 are respectively connected to a metallic thermal conductors 70 in electric. The light emitting chip 50 is electrically connected to the second electrode 42 by direct contact, and electrically connected to the first electrode 41 by wire boding.

Figure 4:
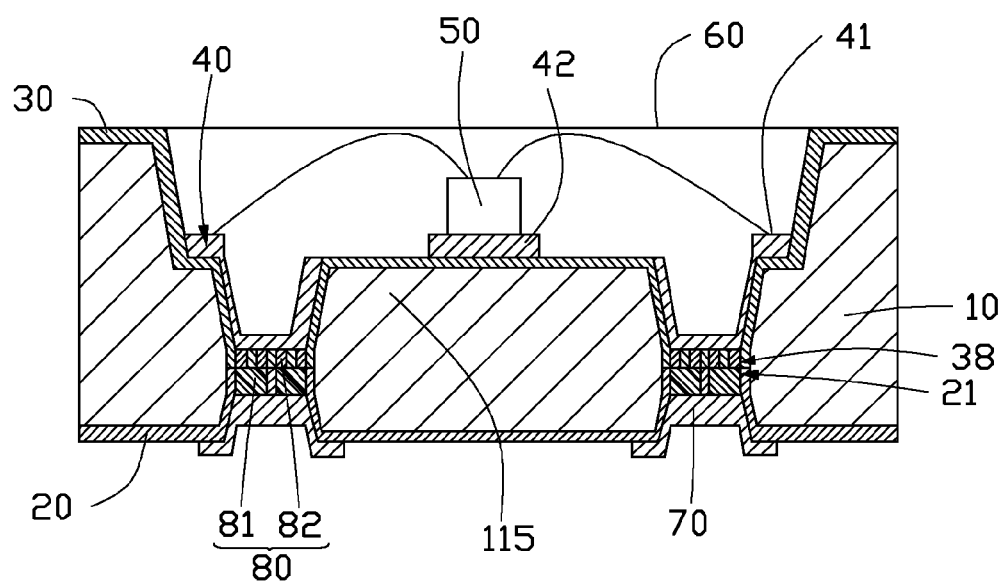
FIG. 4 is a schematic cross section of a light emitting chip package in accordance with a fourth embodiment of the present disclosure.

Referring to FIG. 4, a light emitting chip package according to a fourth exemplary embodiment has a configuration similar to the first embodiment. The light emitting chip package according to the fourth embodiment also includes a substrate 10, an etch stop layer 20, an insulation layer 30, an electric conductive layer 40, a light emitting chip 50, an encapsulation 60, a plurality of metallic thermal conductors 70 and a plurality of electrical conductors 80.

The difference from the first embodiment is that, the step hole 110 of the fourth embodiment includes a platform 115 protruding from a bottom thereof. The second electrode 42 is isolated from the electrical conductors 80 and sits on the platform 115, merely performing a supporting function for the light emitting chip 50.

Figure 5:
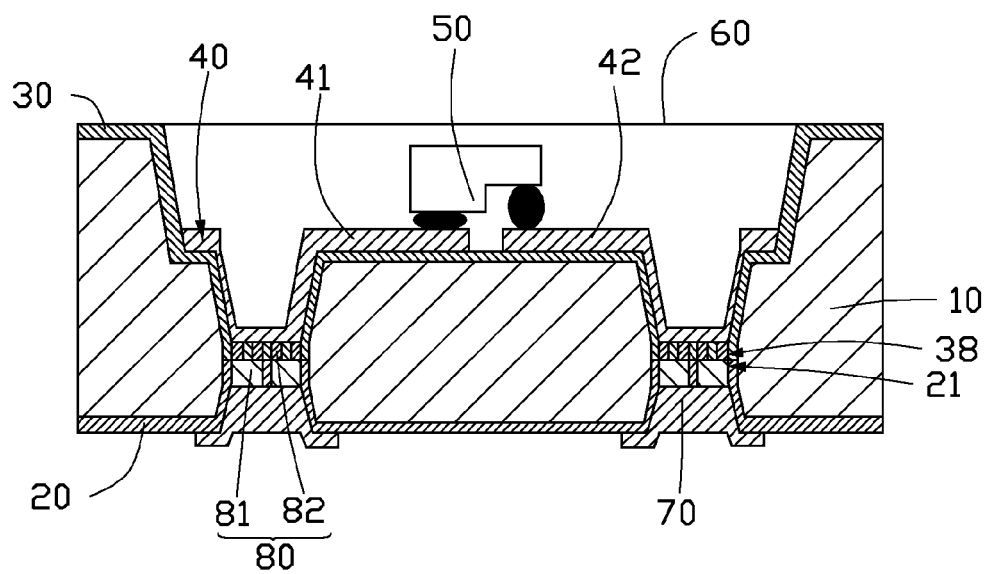
FIG. 5 is a schematic cross section of a light emitting chip package in accordance with a fifth embodiment of the present disclosure.

Referring to FIG. 5, a light emitting chip package according to a fifth exemplary embodiment has a configuration similar to the fourth embodiment. The light emitting chip package according to the fourth embodiment also includes a substrate 10, an etch stop layer 20, an insulation layer 30, an electric conductive layer 40, a light emitting chip 50, an encapsulation 60, a plurality of metallic thermal conductors 70 and a plurality of electrical conductors 80.

The difference from the fourth embodiment is that, the electric conductive layer 40 of the fifth embodiment includes a first electrode 41 on a left hand side, and a second electrode 42 on a right hand side. The first and second electrodes 41, 42 are respectively electrically connected to the metallic thermal conductors 70 via the electrical conductors 80 in electric. The light emitting chip 50 is electrically connected to the first and second electrodes 41, 42 by flip chip technology.

A method for packaging a light emitting chip is provided, take the first embodiment for example. The method generally includes:

step 1: providing a substrate with a top surface and a bottom surface;

step 2: forming a plurality of recesses in the bottom surface of the substrate;

step 3: forming an etch stop layer on the bottom surface, the etch stop layer traversing the recesses;

step 4: forming a step hole in the top surface and exposing the etch stop layer at the top surface side of the substrate;

step 5: forming an insulation layer on the top surface, the insulation layer traversing the step hole;

step 6: forming a plurality of through holes in the insulation layer and the etch stop layer, the through holes in the insulation layer being communicated to the through holes in the etch stop layer;

step 7: filling the plurality of through holes with metal;

step 8: forming a plurality of metallic thermal conductors respectively on portions of the etch stop layer received in the recess;

step 9: forming a patterned electric conductive layer on the insulation layer, the electric conductive layer having two first electrodes and a second electrode;

step 10: arranging a light emitting chip on the second electrode and wire bonding the light emitting chip to the two first electrodes;

step 11: encapsulating the light emitting chip with an encapsulation.

Figure 6:
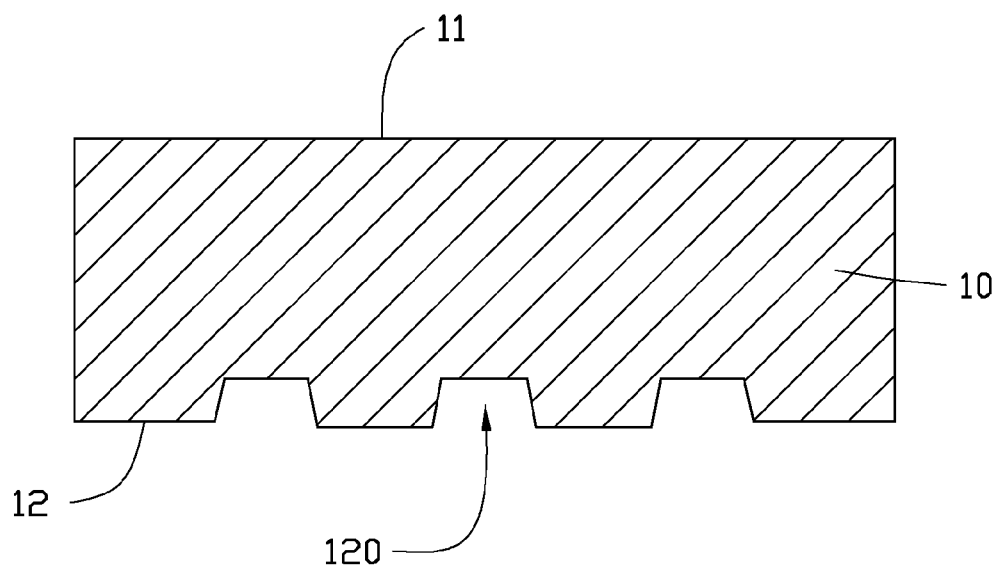
FIG. 6~FIG. 12 are schematic cross sections showing package structures processed by various steps of the method for making the light emitting chip package.

In step 1, referring to FIG. 6, a substrate 10 is provided. The substrate 10 includes a top surface 11 and a bottom surface 12 opposite to the top surface 11. The substrate 10 can be made of electrical conductive materials, for example cooper. The substrate 10 can also be made of insulated materials such as silicon (Si), gallium arsenide (GaAs), zinc oxide (ZnO), indium phosphide (InP) and combination thereof.

In step 2, also referring to FIG. 6, a plurality of recesses 120 is formed on the bottom surface 12 of the substrate 10, by etching. In this embodiment, the plurality of recesses 120 is formed apart from each other.

Figure 7:
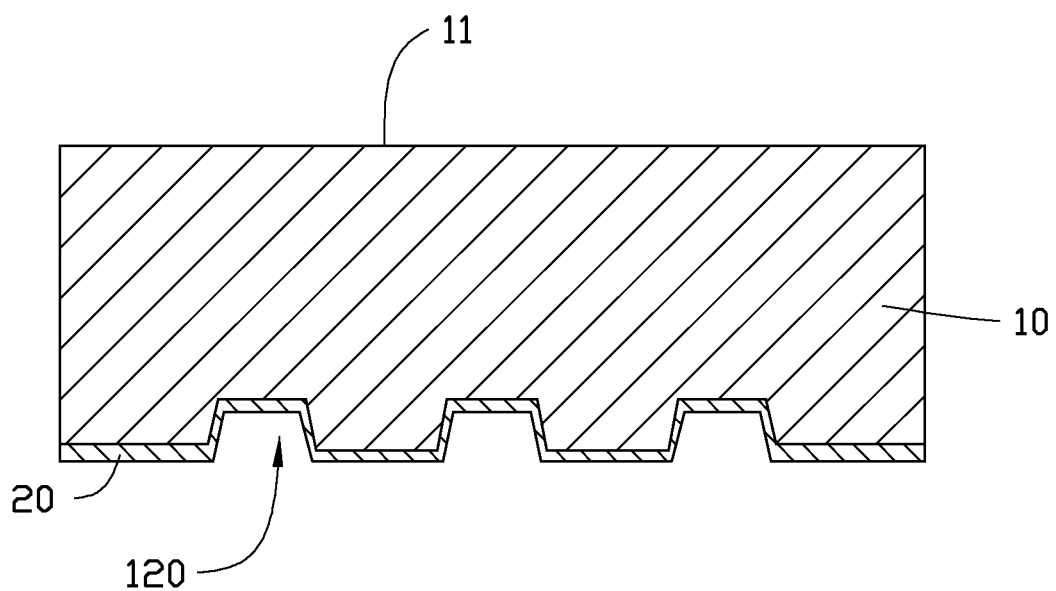

In step 3, referring to FIG. 7, an etch stop layer 20 is formed on the bottom surface 12 of the substrate 10. The etch stop layer 20 traverses bottoms and side walls of the recesses 120. The etch stop layer 20 can be made of insulated materials, for example silicon dioxide ($SiO_2$), silicon nitride ($Si_3N_4$), titanium dioxide ($TiO_2$) or tantalum dioxide ($TaO_2$). In this embodiment, the etch stop layer 20 is made of $SiO_2$.

Figure 8:
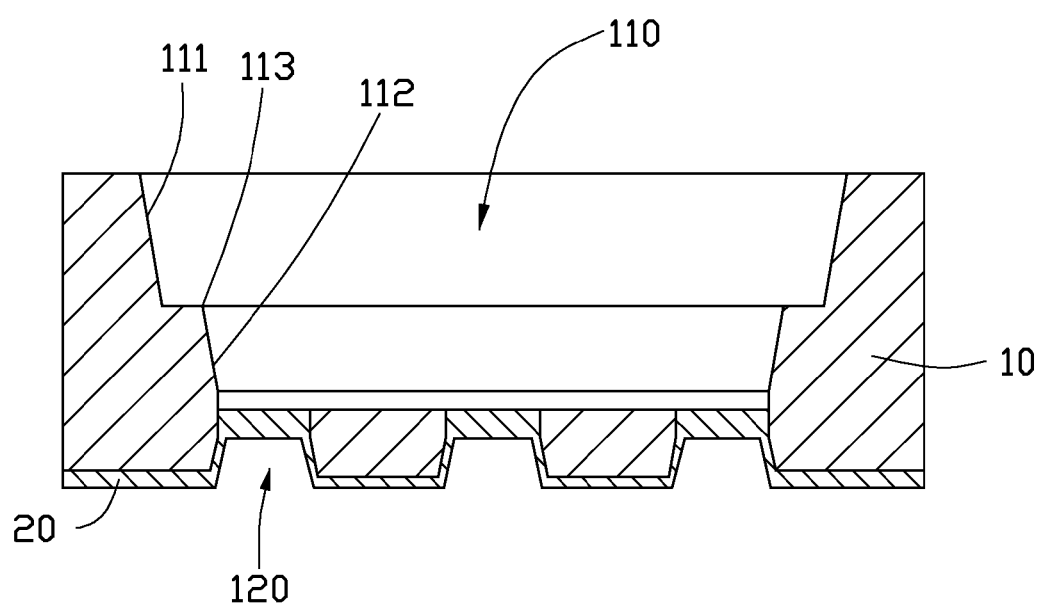

In step 4, referring to FIG. 8, a step hole 110 is formed on the top surface 11 of the substrate. The step hole 110 is communicated with the recess at the bottom of the step hole 110, thereby exposing the etch stop layer 20 at the top side of the substrate 10. After the step hole 110 is formed, each side surface of the step hole 110 includes two inclined surfaces 111, 112 and a horizontal surface 113 connected therebetween.

Figure 9:
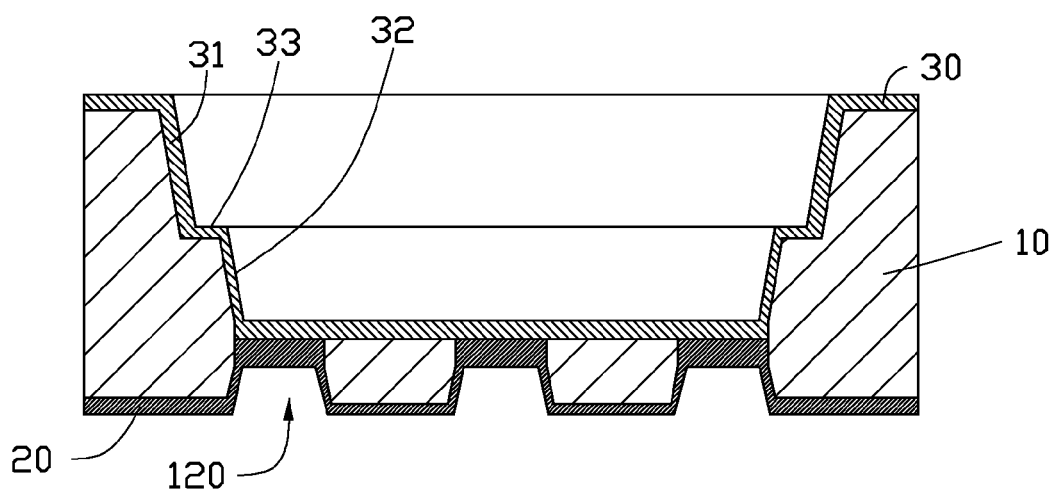

In step 5, referring to FIG. 9, an insulation layer 30 is formed on the top surface 11 of the substrate. The insulation layer 30 traverses the side surfaces and bottom of the step hole 110. The insulation layer 30 includes two inclined portions 31, 32 and a horizontal portion 33 respectively attached to the inclined surfaces 111, 112 and the horizontal surface 113. Further, at the bottom of the step hole 110, the insulation layer 30 contacts the exposed etch stop layer 20. The insulation layer 30 can be made of insulated materials, for example silicon dioxide ($SiO_2$), silicon nitride ($Si_3N_4$), titanium dioxide ($TiO_2$) or tantalum dioxide ($TaO_2$). In this embodiment, the insulation layer 30 is made of $SiO_2$.

Figure 10:
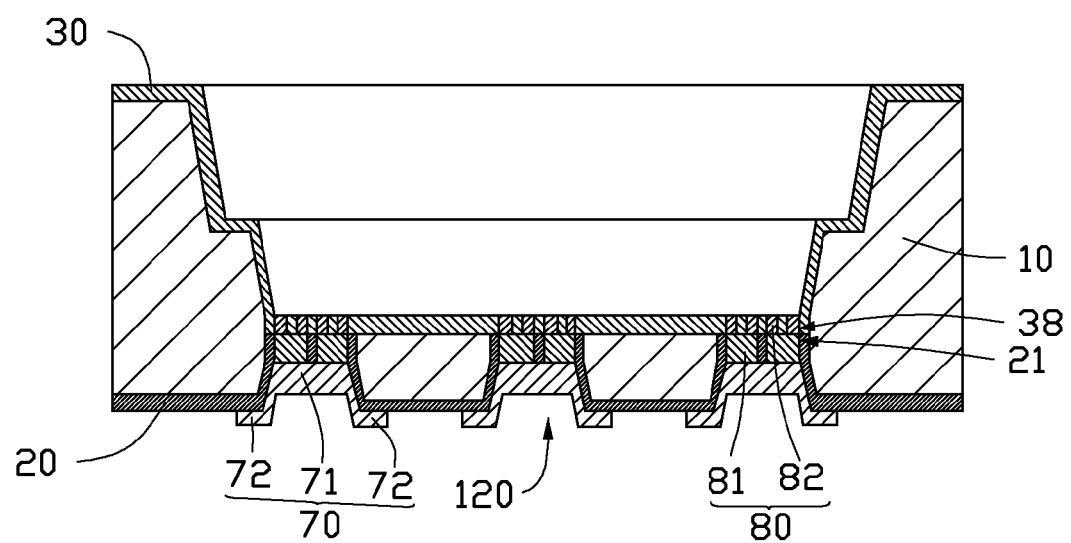

In step 6 and step 7, referring to FIG. 10, the through holes formed in the insulation layer 30 are isolated from each other and filled with electrical conductors 82, and the through holes formed in the etch stop layer 20 are isolated from each other and filled with electrical conductors 81. The through holes in the insulation layer 30 are communicated with the through holes in the etch stop layer 20. As such, each electrical conductor 82 contacts a corresponding electrical conductor 81, thereby forming an electrical connection therebetween.

In step 8, also referring to FIG. 10, the metallic thermal conductors 70 each traverse a corresponding one of the recesses 120. Each metallic thermal conductors 70 includes a main body 71 sitting in a corresponding recess 120, and two side portions 72 each extending from a lateral side of the main body 71. The two side portions 72 each extend firstly along an incline side surface of the recess 120, and then along a horizontal bottom surface of the etch stop layer 20. Thereby, the side portions 72 each define a bent distal ends abutting the bottom of the etch stop layer 20.

Figure 11:
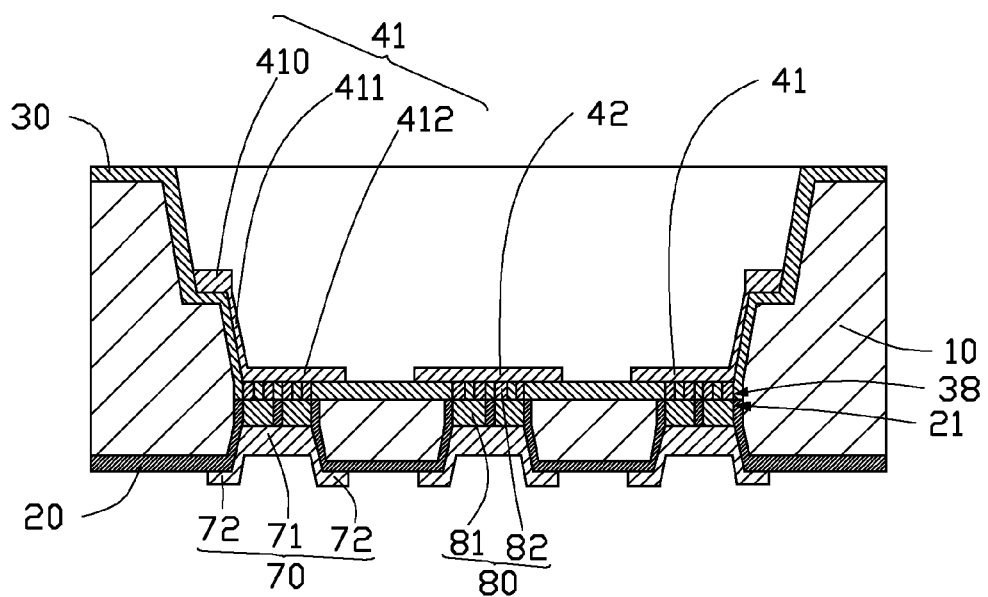

In step 9, referring to FIG. 11, the electric conductive layer 40 includes two first electrodes 41 symmetrical to each other, and a second electrode 42 between the two first electrodes 41. The two first electrodes 41 each includes a retaining portion 410, a reflecting portion 411 and a connecting portion 412. The retaining portion 410 is formed and attached on the horizontal portion 33 of the insulation layer 30. The reflecting portion 411 is formed and attached on the inclined portion 31 of the insulation layer 30, thereby performing a reflecting function. The connecting portion 412 contacts the electrical conductors 82 underneath and forms an electrical connection therebetween.

In step 10, referring to FIG. 11, the light emitting chip 50 (for example, a light emitting diode) is arranged on the second electrode 42 and wire bonding to the two first electrodes 41.

Figure 12:
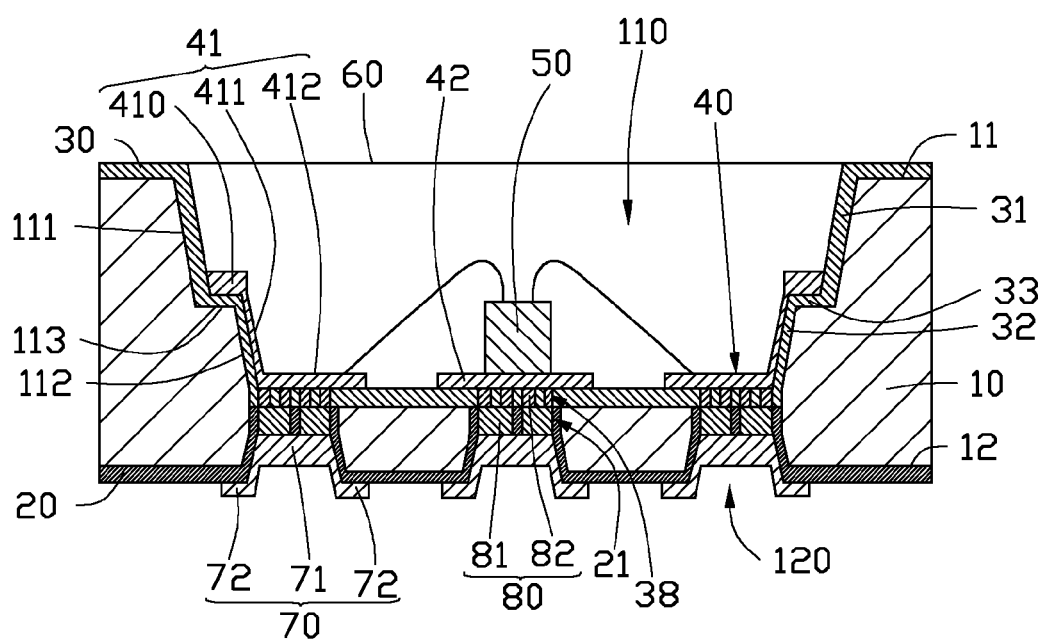

In step 11, referring to FIG. 12, a light transmissive encapsulation 60 is filled in the step hole 110 to cover the light emitting chip 50. In this embodiment, a top surface of the encapsulation 60 is coplanar with that of the insulation layer 30. Furthermore, the encapsulation 60 can be doped with a fluorescent substance.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting chip package, comprising:
a substrate;
an insulation layer arranged on a top surface of the substrate;
a patterned electric conductive layer partially covering the insulation layer;
a light emitting chip arranged on the electric conductive layer;
an encapsulation covering the light emitting chip and the electric conductive layer;
an etch stop layer arranged on a bottom surface of the substrate, a plurality of portions of the etch stop layer in contact with a corresponding plurality of portions of the insulation layer;
a corresponding plurality of thermal conductors formed on the etch stop layer at the bottom surface of the substrate at the portions of the etch stop layer; and
a plurality of electrical conductors penetrating the insulation layer and the etch stop layer and connecting the electric conductive layer with the thermal conductors, the plurality of electrical conductors being isolated from each other;
wherein a plurality of first through holes is defined in each of the portions of the insulation layer, a plurality of second through holes is defined in each of the portions of the etch stop layer, and the number of first through holes is different from the number of second through holes; and
the plurality of electrical conductors comprises a plurality of first electrical conductor portions filled in the first through holes, respectively, and a plurality of second electrical conductor portions filled in the second through holes, respectively, and the first electrical conductor portions are in contact with corresponding second electrical conductor portions.

2. The light emitting chip package of claim 1, wherein the patterned electric conductive layer comprises two isolated islands, the light emitting chip being mounted on the two isolated islands.

3. The light emitting chip package of claim 1, wherein the patterned electric conductive layer comprises two first electrodes and a second electrode, the two first electrodes and the second electrode being isolated from each other, the second electrode being arranged between the two first electrodes.

4. The light emitting chip package of claim 3, wherein the light emitting chip is arranged on the second electrode, the light emitting chip having two electrodes respectively wire bonded to the two first electrodes.

5. The light emitting chip package of claim 1, wherein a diameter of each of the first through holes defined in the insulation layer is different from that of each of the second through holes defined in the etch stop layer, and correspondingly a diameter of each of the first electrical conductor portions arranged in the insulation layer is different from that of each of the second electrical conductor portions arranged in the etch stop layer.

6. The light emitting chip package of claim 5, wherein a diameter of each of the first through holes defined in the insulation layer is smaller than that of each of the second through holes defined in the etch stop layer, and correspondingly a diameter of each of the first electrical conductor portions arranged in the insulation layer is smaller than that of each of the second electrical conductor portions arranged in the etch stop layer.

7. The light emitting chip package of claim 1, wherein the number of first through holes in the insulating layer is greater than the number of second through holes in the etch stop layer, and correspondingly the number of first electrical conductor portions filled in the first through holes is greater than the number of second electrical conductor portions filled in the second through holes.

* * * * *